(12) United States Patent
Toyoda et al.

(10) Patent No.: US 8,197,055 B2
(45) Date of Patent: Jun. 12, 2012

(54) PATTERNING METHOD, DROPLET DISCHARGING DEVICE AND CIRCUIT BOARD

(75) Inventors: Naoyuki Toyoda, Suwa (JP); Hirotsuna Miura, Fujimi (JP)

(73) Assignee: Seiko Epson Corporation (JP)

( * ) Notice: Subject to any disclaimer, the term of this patent is extended or adjusted under 35 U.S.C. 154(b) by 1197 days.

(21) Appl. No.: 11/934,935

(22) Filed: Nov. 5, 2007

(65) Prior Publication Data

US 2008/0122897 A1    May 29, 2008

(30) Foreign Application Priority Data

Nov. 29, 2006 (JP) ................... 2006-321263
Nov. 29, 2006 (JP) ................... 2006-321264
Jul. 20, 2007 (JP) ................... 2007-189151

(51) Int. Cl.
*B41J 2/01* (2006.01)
(52) U.S. Cl. ........................................ 347/104
(58) Field of Classification Search ............. 347/104
See application file for complete search history.

(56) References Cited

U.S. PATENT DOCUMENTS

| 6,336,722 | B1* | 1/2002 | Wotton et al. ............. 347/102 |
| 6,469,396 | B1 | 10/2002 | Kawai |
| 6,548,910 | B2 | 4/2003 | Kawai |
| 6,808,566 | B2 | 10/2004 | Kitano et al. |
| 7,354,146 | B2* | 4/2008 | Yraceburu et al. ........... 347/102 |
| 7,592,032 | B2 | 9/2009 | Miyasaka |
| 2002/0018850 | A1 | 2/2002 | Yamazaki et al. |
| 2003/0213614 | A1 | 11/2003 | Furusawa et al. |
| 2004/0096634 | A1 | 5/2004 | Taga et al. |
| 2005/0089635 | A1 | 4/2005 | Hasei |

FOREIGN PATENT DOCUMENTS

| CN | 1326592 A | 12/2001 |
| CN | 1499913 | 5/2004 |
| CN | 1524699 | 9/2004 |
| JP | 02-267175 | 10/1990 |
| JP | 11-281985 | 10/1999 |
| JP | 2003-133692 | 5/2003 |
| JP | 2004-306372 | 11/2004 |
| JP | 2004-347695 | 12/2004 |
| JP | 2005-502452 | 1/2005 |
| JP | 2005-057140 | 3/2005 |
| JP | 2006-75747 | 3/2006 |
| JP | 2006-239565 | 9/2006 |
| TW | 554430 | 9/2003 |
| TW | I266572 | 11/2006 |
| WO | 03-022581 | 3/2003 |

* cited by examiner

*Primary Examiner* — Jerry Rahll
(74) *Attorney, Agent, or Firm* — Harness, Dickey 8 Pierce, P.L.C.

(57) ABSTRACT

A method for producing a pattern on a substrate includes discharging a droplet on a top surface of a breathable substrate being heated, the droplet being formed with a functional fluid containing a functional material, so as to produce the pattern on the top surface of the breathable substrate.

5 Claims, 8 Drawing Sheets

PATTERNING METHOD, DROPLET DISCHARGING DEVICE AND CIRCUIT BOARD

RELATED APPLICATIONS

This application claims priority to Japanese Patent Application Nos. 2006-321263 filed Nov. 29, 2006, 2006-321264 filed Nov. 29, 2006 and 2007-189151 filed Jul. 20, 2007 which are hereby expressly incorporated by reference herein in their entirety.

BACKGROUND

1. Technical Field

The present invention relates to a patterning method, a droplet discharging device, and a circuit board.

2. Related Art

An inkjet method in which a functional fluid is discharged as droplets is gaining attention as an effective technique for producing a desired pattern on a substrate (for example, refer to JP-A-2004-347695).

A conventional inkjet system includes a stage for placing a substrate, a droplet discharging head for discharging a functional fluid containing a functional material on the substrate, and a mechanism for causing relative two-dimensional movement of the substrate (stage) and the discharging head. In the inkjet system, the droplets discharged from the droplet discharge head are disposed to optional locations on the substrate surface by the relative movement of the substrate and the droplet discharging head. Droplets sequentially disposed on the substrate surface produce a pattern formed with the functional fluid. If, the droplets spread far enough to overlap with one another, the substrate surface may be completely covered without gaps.

However, when the substrate surface is repellent to the functional fluid, the attractive power with which the substrate surface pulls the droplets is weaker than the attractive pulling power working between the adjacent droplets. Therefore, the functional fluid gathers up locally on the substrate surface. Such local gathering prevents an even coverage of the functional fluid on the substrate surface. In fact, as the local gathering grows, a part of the substrate surface may become exposed due to a lack of functional fluid.

To avoid such local gathering in an inkjet system that places adjacent droplets to overlap with one another, a prior droplet needs to be sufficiently dried before a subsequent droplet is applied. As a result, a long time is required to carry out the patterning process. One suggestion to resolve this problem is to preheat the substrate so as to quickly dry the landing droplets (for instance, refer to JP-A-2004-306372 and JP-A-11-281985).

However, if the substrate temperature increases, the droplets boil violently upon landing and the pattern is not produced. Therefore, increasing the substrate temperature has imitations for increasing the drying speed, and thus there is a limit as to how short the time required for patterning can be made.

SUMMARY

An advantage of certain aspects of the invention is to provide a patterning method, a droplet discharging device, and a circuit board which allows the formation of highly precise patterns in a short period of time.

According to a first aspect of the invention, a method for producing a pattern on a substrate includes discharging a droplet on a top surface of a breathable substrate being heated, the droplet formed with a functional fluid containing a functional material, so as to produce the pattern on the top surface of the breathable substrate.

In the patterning method, a heated substrate promotes the evaporation of landing droplets. Since the substrate is breathable, the vapor of the droplets diffuses into the interior of the substrate. Such a patterning method therefore improves the drying speed of the droplets.

In this patterning method, a pressure beneath the breathable substrate is reduced during the discharging of the droplet.

With this patterning method, the vapor constituent of the droplet diffuses inside the substrate. At this time, the pressure beneath the breathable substrate is reduced, promoting the diffusion into the interior of the breathable substrate. As a result, the drying efficiency of the droplet is improved.

In this patterning method, during the discharging of the droplet, the breathable substrate placed on a stage with breathability and porosity is attracted to the stage.

In this patterning method, the breathable substrate is placed on a porous stage provided with breathability. The pressure beneath the breathable substrate is therefore evenly reduced when the lower part of the breathable stage is decompressed. Consequently, the evaporation of the droplets landing on the breathable substrate is evenly promoted without irregularity throughout the surface adjacent to the breathable substrate, independently from the landing location.

In this patterning method, during the discharging of the droplet, a surface temperature of the breathable substrate is set to a temperature equal to or above a temperature of the functional fluid at the time of discharging the droplet, as well as to a temperature below a boiling point of a liquid composition included in the functional fluid.

With this patterning method, the drying of droplets landing on the breathable substrate starts immediately, since the surface temperature of the breathable substrate is higher than that of the functional fluid upon discharging. Moreover, since the surface temperature of the breathable substrate is lower than the boiling point of the liquid composition, the droplets do not boil violently on the substrate. As a result, this patterning method allows highly precise high density patterning in a short period of time.

In this patterning method, the porous breathable substrate is also a low temperature firing sheet composed with a ceramic particle and resin. At the same time, in this patterning method, the functional fluid is a fluid into which a metal particle is dispersed as a functional material.

This patterning method allows the forming of the pattern formed with the metal film on a porous substrate clearly and precisely in a short period of time.

According to a second aspect of the invention, a droplet discharging device includes: a stage for placing a breathable substrate; a heating unit included in the stage so as to heat the substrate; and a droplet discharging head for discharging a functional fluid containing a functional material as a droplet onto a top surface of the substrate placed on the stage so as to produce a pattern on the top surface of the substrate, where the stage and the droplet discharging head move relative to one another.

According to above droplet discharging device, a heated substrate promotes the evaporation of the landing droplets. Since the substrate is breathable, the vapor of the droplets diffuses into the interior of the substrate. This improves the drying speed of droplets.

In this droplet discharging device, the stage includes a placing unit for placing the substrate, the placing unit having breathability, and a decompressing unit for reducing a pressure beneath the substrate placed on the placing unit through the decompressing unit.

According to this droplet discharging device, when, for instance, the breathable substrate is placed on a breathable stage, reducing the pressure beneath the breathable stage with the decompression unit reduces the pressure beneath the breathable substrate. Therefore, the vapor constituent of the landing droplets diffuses into the interior of the breathable substrate. At this time, since the pressure beneath the breathable substrate is reduced, the diffusion into the interior of the breathable substrate is promoted. As a result, the droplet discharging device improves the drying speed.

According to a third aspect of the invention, a circuit board includes a circuit element mounted thereto and an interconnection electrically coupled to the circuit element, where the interconnection is formed with the above patterning method.

Such a circuit board improves productivity.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

A first embodiment according to the invention will now be described with reference to FIGS. 1 through 8D. The first embodiment embodies aspects of the invention into a method for producing an interconnection pattern on a plurality of low temperature fired substrates (green sheets) which constitute a low temperature co-fired ceramics (LTCC) multilayer substrate used for a circuit module including a semiconductor chip mounted on the LTCC substrate.

Figure 1:
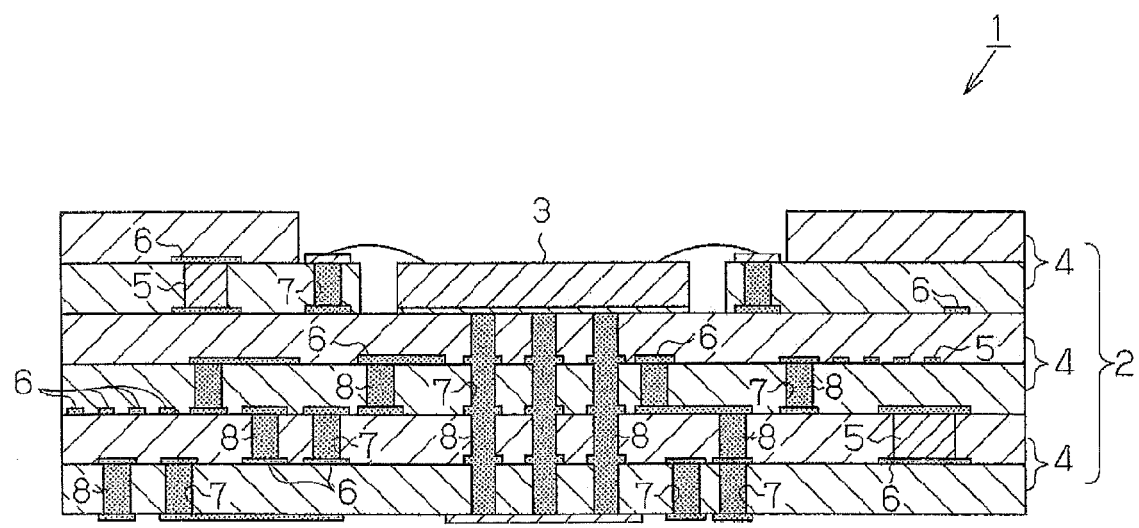
FIG. 1 is a sectional side view of a circuit module.

The circuit module including a semiconductor chip mounted on the LTCC multilayer substrate will now be described. FIG. 1 is a sectional drawing of a circuit module 1. The circuit module 1 includes an LTCC multilayer substrate 2 formed having a planer shape, and a semiconductor chip 3 coupled in a wire bonding on the top side of the LTCC multilayer substrate 2.

The LTCC multilayer substrate 2 is a laminate of a plurality of low temperature fired substrates 4 formed in a sheetlike form. Each of the low temperature fired substrates 4 is a sintered body, in other words, a porous substrate made of glass ceramics material (for instance, a mixture of a glass constituent such as alkali oxide borosilicate and a ceramic constituent such as alumina), and the thickness thereof is several hundred μms.

Figure 2:
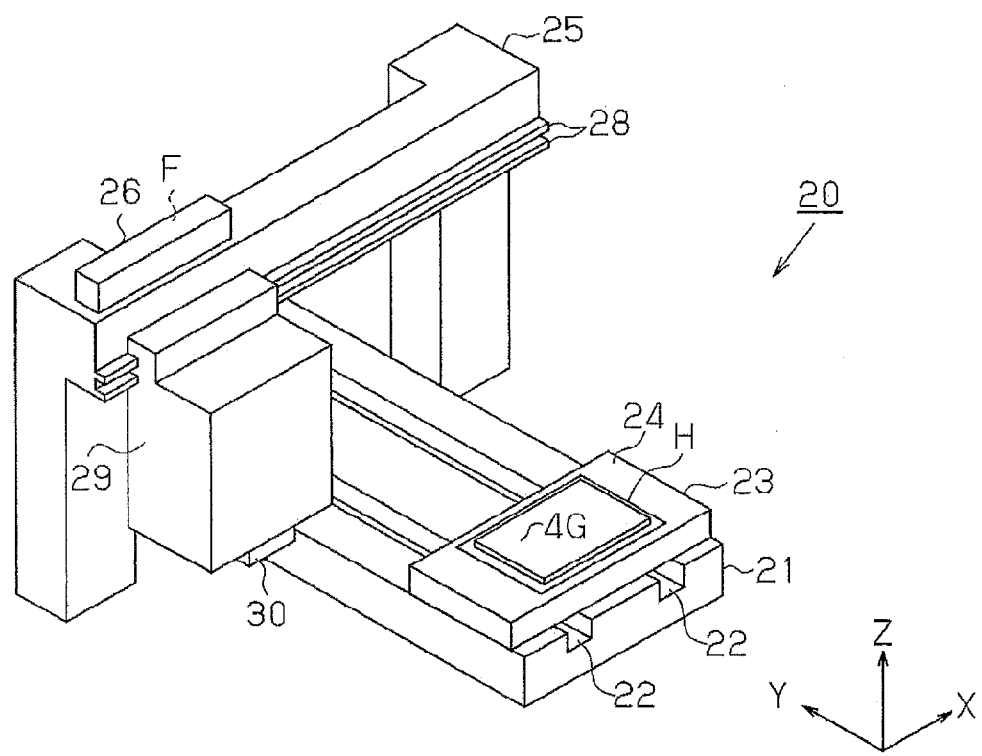
FIG. 2 is a perspective view of a droplet discharging device.
Figure 4:
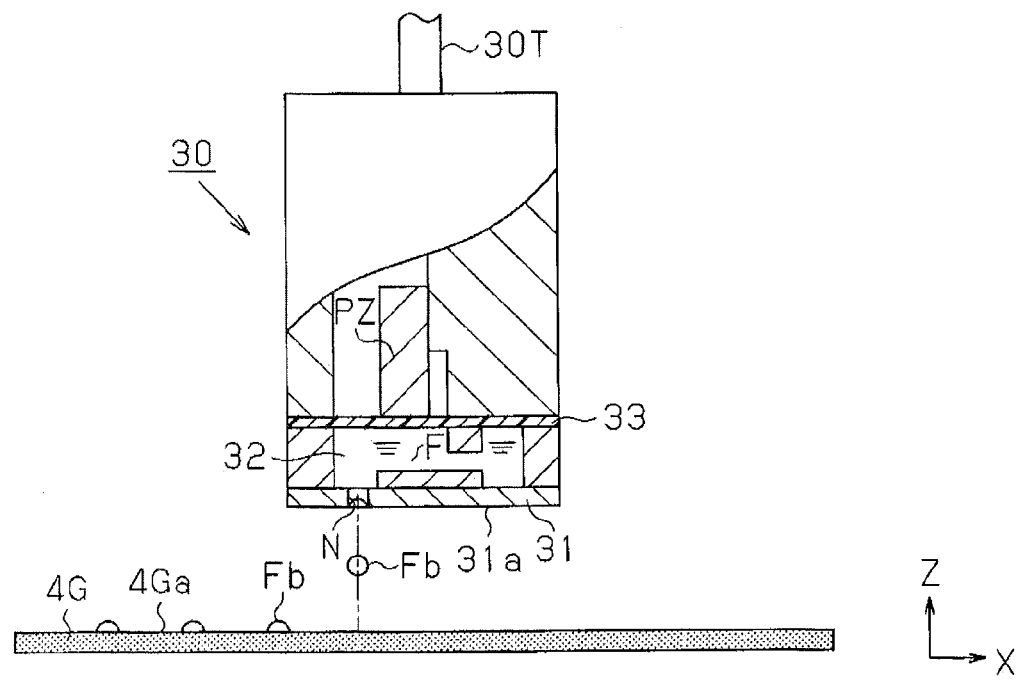
FIG. 4 is a sectional side view of parts of the droplet discharging head.
Figure 7:
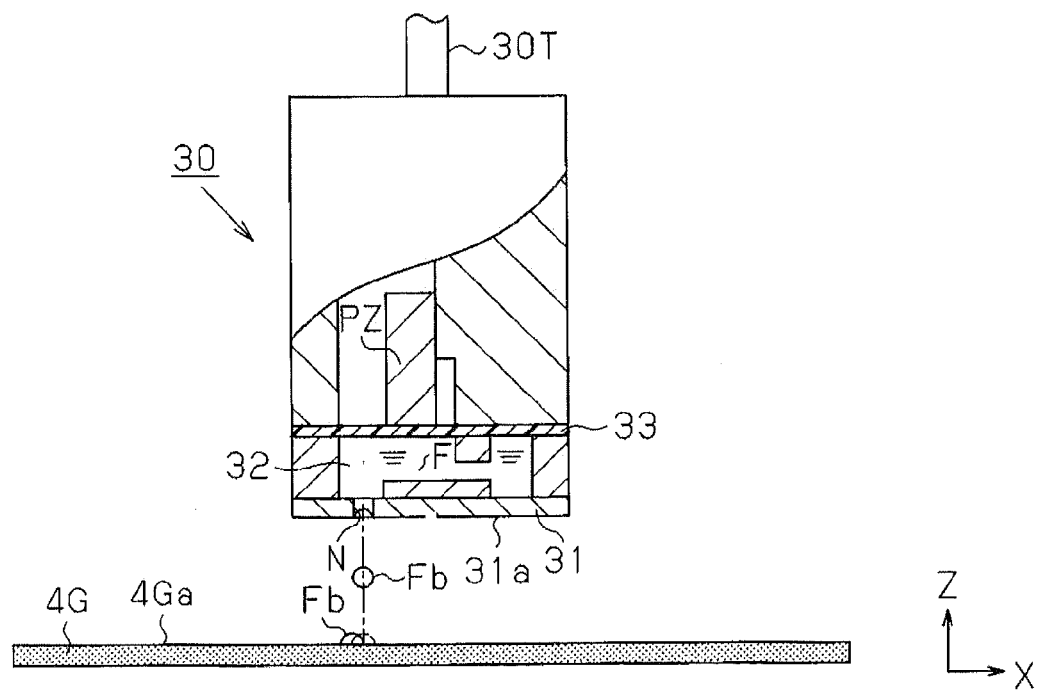
FIG. 7 is a partial cross-sectional view showing the operation of a pattern formation process.

Each of the low temperature fired substrates 4 prior to their sintering is called a green sheet 4G (refer to FIGS. 2, 4, and 7). Powder of a glass ceramics material and a dispersion medium is mixed together with a binder and a foam control agent, so as to prepare a slurry. This slurry is made into a planer shape, and thereafter dried, thereby becoming the green sheet 4G provided with breathability. In other words, the green sheet 4G is a breathable substrate.

Each of the low temperature fired substrates 4 include: various circuit elements 5 such as a resistor, a capacitor, and a coil; internal interconnections 6 that electrically couples the circuit elements 5; a plurality of via holes 7 which have a stack via structure or a thermal via structure, provided with a predefined hole diameter (for instance, 20 μm); and a plurality of via interconnections 8 filled into the via holes 7.

The internal interconnections 6 on the low temperature fired substrates 4 are sintered bodies made of metallic particulates including metals such as silver and silver alloys, and are formed with an interconnection patterning method which uses a droplet discharging device 20 shown in FIG. 2.

FIG. 2 is an overall perspective view of the droplet discharging device 20.

Referring to FIG. 2, the droplet discharging device 20 has a base 21 formed in a rectangular shape. A pair of guiding grooves 22 is formed, extending along a longitudinal direction (hereafter referred to as "y-axis direction") of the base 21 on the top surface of the base 21. A stage 23 is provided above the through hole 22, moving forward and backward in the y-axis direction.

A placing unit 24 is formed on the top surface of the stage 23, so as to place the low temperature fired substrates 4 (the green sheet 4G that is provided with breathability) on the placing unit 24 prior to the firing. The placing unit 24 positions and fixes, with respect to the stage 23, the green sheet 4G which is in the adjusted state for its placement, and carries the green sheet 4G forward and backward in the y-axis direction. A rubber heater H is installed on the top surface of the stage 23. The entire top surface of the green sheet 4G placed in the placing unit 24 is increased to a predetermined temperature, heated by the rubber heater H.

A guide 25 with a shape of a portal straddling across the base 21 in the direction perpendicular to the y-axis direction (hereafter referred to as "x-axis direction"). An ink tank 26 extending in the x-axis direction is installed on the guide 25. The ink tank 26 pools a metallic ink F that serves as a functional fluid, and supplies the metallic ink F to a droplet discharging head (hereafter referred to as "discharging head") 30 in a predetermined pressure. The metallic ink F supplied to the discharging head 30 is discharged as droplets Fb (refer to FIG. 4) from the discharging head 30 toward the green sheet 4G.

The metallic ink F may contain colloid systems, which is a liquid resultant of which metallic particulates are dispersed into a solvent, the particulates having a grain diameter of, for instance, several nm to several tens of nm.

Examples of metallic particulates used for the metallic ink F include: materials such as gold (Au), silver (Ag), copper (Cu), aluminum (Al), palladium (Pd), manganese (Mn), titanium (Ti), tantalum (Ta), and nickel (Ni); oxides thereof; and superconducting particulates. The grain diameter of the metallic particulates is preferably between 1 nm and 0.1 μm inclusive. If the diameter of the metallic particulates is larger than 0.1 μm, nozzle clogging may occur at nozzles N in the discharging head 30. If the diameter of the particulate is smaller than 1 nm, a volume ratio of the dispersion agent with respect to the metallic particulates increases, and the proportion of the organic matter in the obtained film becomes excessive.

There is no specific limitation imposed on the dispersion medium, as long as the above metallic particulates are dispersed therein and as long as the medium does not cause coagulation. More specifically, examples of materials, in addition to solvents of waters, include: alcohols such as methanol, ethanol, propanol, and butanol; hydrocarbon compounds such as n-heptane, n-octane, decane, dodecane, tetradecane, toluene, xylene, cymene, durene, indene, dipentene, tetrahydronaphthalene, decahydronaphthalene, and cyclohexylbenzene; polyols such as ethylene glycol, diethylene glycol, triethylene glycol, glycerin, and 1,3-propanediol; ether compounds such as polyethylene glycol, ethylene glycol dimethyl ether, ethylene glycol diethyl ether, ethylene glycol ethyl methyl ether, diethylene glycol dimethyl ether, diethylene glycol diethyl ether, diethylene glycol methyl ethyl ether, 1,2-dimethoxyethane, bis(2-methoxyethyl)ether, and p-dioxane; and polar compounds such as propylene carbonate gamma-butyrolactone, N-methyl-2-pyrrolidone, dimethylformamide, dimethyl sulfoxide, cyclohexanone, and ethyl lactate. Among the above, the preferable dispersion media include water, alcohols, hydrocarbon compounds, and ether compounds. These media are preferable in terms of dispersibility of particulates, stability of a dispersed liquid, and ease of application to the liquid droplet discharging method. In particular, water and hydrocarbon compounds are the preferable diffusion media.

Figure 6:
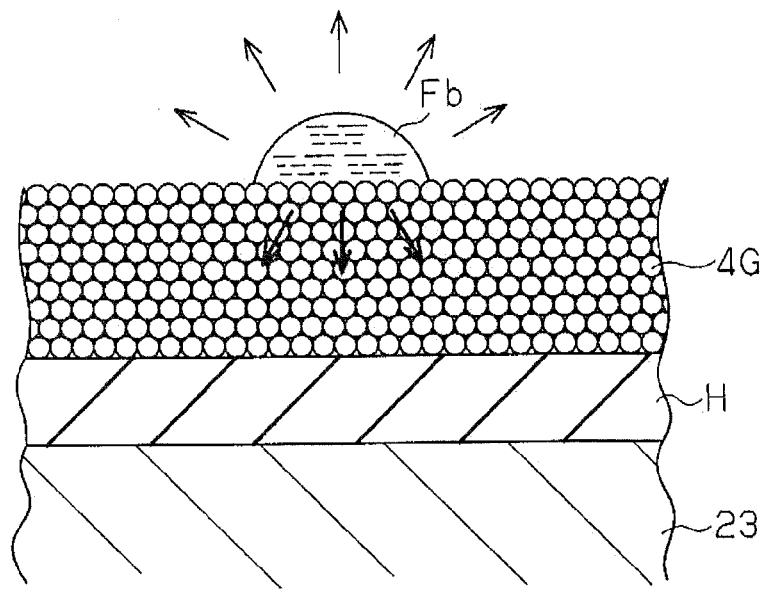
FIG. 6 is a schematic view of the green sheet.

The metallic ink F landing on the green sheet 4G vaporizes part of the solvent or the dispersion medium from the surface thereof. At this time, since the green sheet 4G is heated, the evaporation of the solvent or the dispersion medium contained in the metallic ink F is promoted. Moreover, as shown in FIG. 6, since the green sheet 4G is a breathable substrate, the metallic ink F landing on the green sheet 4G vaporizes part of its solvent or dispersion medium through the green sheet 4G, also from the side adjacent to the green sheet 4G. Therefore, the metallic ink F landing on the green sheet 4G is dried in an even shorter period of time. In this embodiment, the droplets Fb landing on the green sheet 4G do not interfuse into the green sheet 4G, since the porosity of the green sheet 4G and the contact angle of the metallic ink F landing on the green sheet 4G (breathable substrate) are set to a predetermined range.

The viscosity of the metallic ink F landed on the green sheet 4G is increased as its surface dries from the outer edge. This is since the concentration of the solid constituent (particulates) at the periphery of the metallic ink F that landed on the green sheet 4G reaches a saturating concentration faster relative to the center. The metallic ink F with increased viscosity prevents itself from spreading in the planer direction of the green sheet 4G, by pinning the outer edge of the metallic ink F. The metallic ink F is fixed to the green sheet 4G at its pinning site. The droplet of the metallic ink F that landed previously to the other is in the state of pinning, and therefore is not pulled closer to a subsequent droplet Fb which covers the previous one, since the previous one is fixed to the green sheet 4G.

On the guide 25, a pair of guiding rails 28 is installed, extending in the x-axis direction, across approximately the entire width in the x-axis direction, the pair being arranged one above the other. A carriage 29 is installed on the vertically arranged pair of guiding rails 28. The carriage 29 moving forward and backward in the x-axis direction, guided by the guiding rails 28. The droplet discharging head 30 is mounted on the carriage 29.

Figure 3:
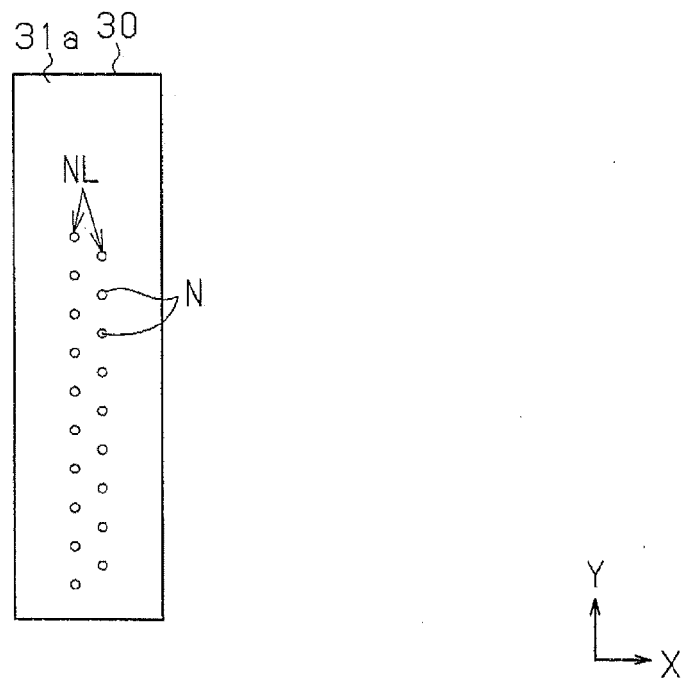
FIG. 3 is a bottom view of a droplet discharging head viewed from a green sheet.

FIG. 3 is a bottom view of the discharging head 30 viewed from the green sheet 4G, and FIG. 4 is a sectional view of main parts of the droplet discharging head. A nozzle plate 31 is provided under the discharging head 30. The bottom surface of the nozzle plate 31 is formed approximately in parallel to the top surface of the green sheet 4G. Hereafter, the bottom surface of the nozzle plate 31 is called a nozzle-formed surface 31a, and the top surface of the green sheet 4G is called a discharged surface 4Ga. The nozzle plate 31 keeps the distance between the nozzle-formed surface 31a and the discharged surface 4Ga (hereafter referred to as "platen gap") to a predetermined distance, for instance, 600 μm, when the green sheet 4G is located directly below the discharging head 30.

Referring back to FIG. 3, a pair of nozzle rows NL is formed on the nozzle-formed surface 31a, each including a plurality of nozzles N arranged in the y-axis direction. Each of the nozzle rows NL includes 180 nozzles N per inch. For the convenience of description, FIG. 3 illustrates only ten nozzles N for each row.

When viewed in the x-axis direction, the nozzles N in one of the pair of the nozzle rows NL are arranged so as to fill the gap between the nozzles N in the other row of that pair. In other words, the discharging head 30 includes 360 nozzles N per inch (180*2=360) in the y-axis direction, having the maximum resolution of 360 dpi in the y-axis direction.

Referring now to FIG. 4, a supply tube 30T that serves as a channel is coupled on the top of the discharging head 30. The supply tube 30T is installed extending in the z-axis direction, supplying the metallic ink F from the ink tank 26 to the discharging head 30.

On the top of nozzles N, a cavity 32 is formed, connected continuously to the supply tube 30T. The cavity 32 pools the metallic ink F supplied from the supply tube 30T, and supplies part of the metallic ink F to the nozzles N continuously connected from the supply tube 30T. An oscillating plate 33 is adhered on the top of the cavity 32, the oscillation thereof in the z-axis direction, expanding and shrinking the volume of the cavity 32. Piezoelectric elements PZ are installed on the top of the oscillating plate 33, each corresponding to one of the nozzles N. The piezoelectric elements PZ oscillate the semiconductor chip 3 in the z-axis direction, by stretching and contracting in that direction. The oscillating plate 33 oscillating in the z-axis direction ejects the metallic ink F from the nozzles N in the droplets Fb in a predetermined size. The droplets Fb being discharged fly in the negative z-axis direction from the nozzles N, and thereafter lands in the discharged surface 4Ga of the green sheet 4G.

The electric configuration of the droplet discharging device 20 formed as above will now be described with reference to FIG. 5.

Figure 5:
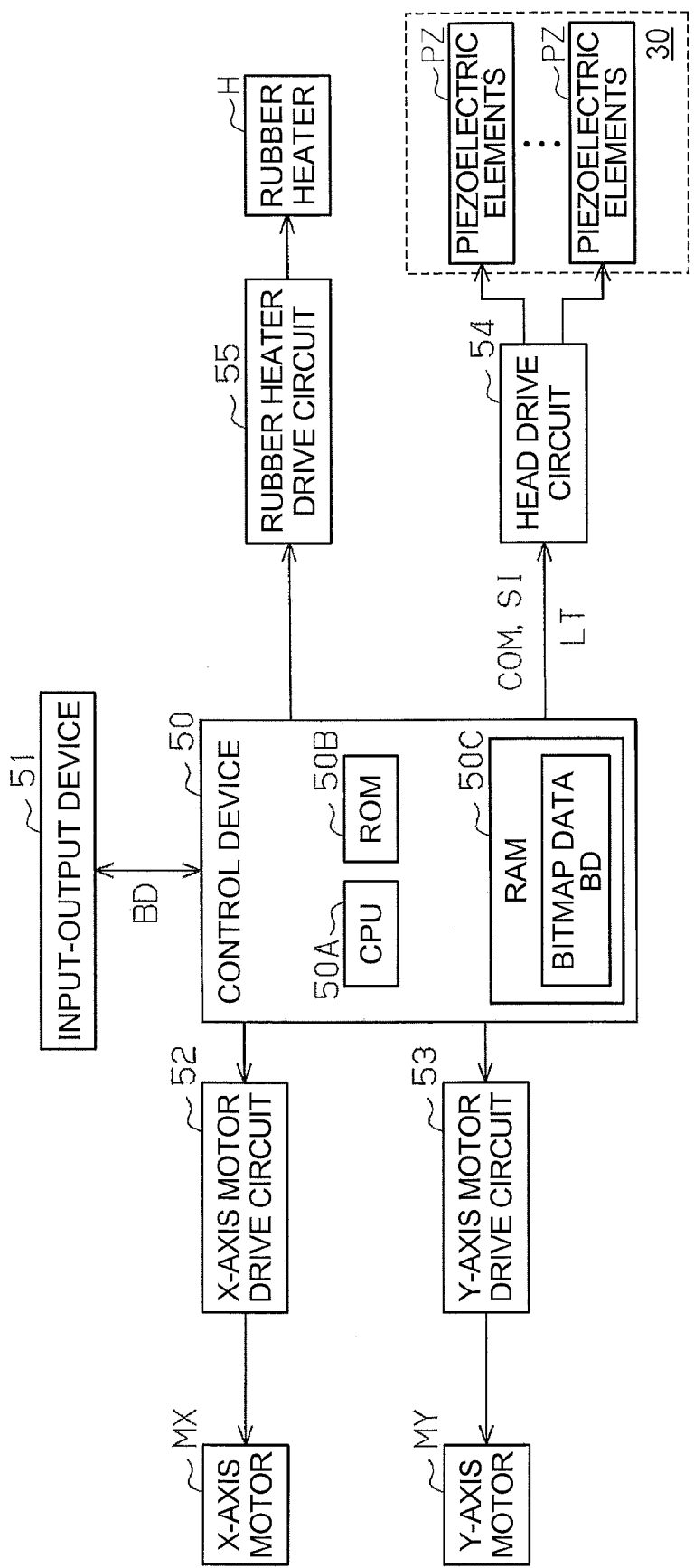
FIG. 5 is a block circuit diagram of the droplet discharging device.

Referring to FIG. 5, a control device 50 includes units such as a CPU 50A, ROM 50B, and RAM 50C. The control device 50 carries out, in accordance with various data and various control programs stored therein, sets of processing for: carrying the stage 23 and the carriage 29; discharging droplets with the discharging head 30; and heating the rubber heater H.

An input-output device 51 that has a display and various switches for operation is coupled to the control device 50. The input-output device 51 displays the processing status executed by the droplet discharging device 20. The input-output device 51 generates bitmap data BD for forming the internal interconnections 6, and inputs the bitmap data BD into the control device 50.

The bitmap data BD defines the on state or off state of each of the piezoelectric elements PZ, corresponding to the value "0" or "1" of each bit. In other words, the bitmap data defines whether or not the droplets Fb for forming an interconnection are discharged on the drawing plane (discharged surface 4Ga) where the discharging head 30 i.e. the nozzles N pass through. That is to say, the bitmap data BD is used for discharging the droplets Fb for forming an interconnection to target positions for forming the internal interconnections 6 defined on the discharged surface 4Ga.

An x-axis motor drive circuit 52 is coupled to the control device 50. The control device 50 outputs a drive control signal to the x-axis motor drive circuit 52. The x-axis motor drive circuit 52 rotates an x-axis motor MX in normal or in reverse rotation, in response to the drive control signal from the control device 50. The x-axis motor MX moves the carriage 29. A y-axis motor drive circuit 53 is coupled to the control device 50. The control device 50 outputs the drive control signal to the y-axis motor drive circuit 53. The y-axis motor drive circuit 53 rotates a y-axis motor MY in normal or in reverse rotation, in response to the drive control signal from the control device 50. The y-axis motor MY moves the stage 23.

A head drive circuit 54 is coupled to the control device 50. The control device 50 generates a discharging-timing signal LT in synchronization with a predetermined discharging frequency, and outputs the discharging-timing signal LT to the head drive circuit 54. The control device 50 outputs a driving voltage COM for driving each of the piezoelectric elements PZ to the head drive circuit 54, in synchronization with the discharging frequency.

Using the bitmap data BD, the control device 50 generates a pattern forming control signal SI in synchronization with a predetermined frequency, and carries out serial transmission of the pattern forming control signal SI to the head drive circuit 54. The head drive circuit 54 sequentially carries out a serial/parallel conversion of the pattern forming control signal SI sent from the control device 50, in correspondence with each of the piezoelectric elements PZ. Every time the head drive circuit 54 receives the discharging-timing signal LT from the control device 50, it latches the pattern forming control signal SI that underwent the serial/parallel conversion, and supplies the driving voltage COM to the piezoelectric elements PZ selected by the pattern forming control signal SI.

A rubber heater drive circuit 55 is coupled to the control device 50. The control device 50 outputs the drive control signal to the rubber heater drive circuit 55. The rubber heater drive circuit 55 drives the rubber heater H in response to the drive control signal from the control device 50, and thereby controls the temperature of the green sheet 4G placed on the stage 23 to a predetermined temperature. In this embodiment, the predetermined temperature of the green sheet 4G, in other words, the temperature of the discharged surface 4Ga is equal to or higher than that of the metallic ink F at the time of its discharging from the discharging head 30, and, less than a boiling point of a liquid composition included in the metallic ink F. At this time, the boiling point of the liquid composition means the boiling point of a material with the lowest boiling point among the liquid compositions contained in the metallic ink F.

That is to say, the control device 50 controls the temperature of the green sheet 4G to be equal to or higher than that of the metallic ink F at the time of its discharging from the discharging head 30. Consequently, the metallic ink F is not dried at the discharging head 30 during discharging, but is quickly heated and dried when it lands as the droplets Fb. Moreover, the control device 50 controls the temperature of the green sheet 4G to be less than that of the liquid composition. The metallic ink F is thereby heated to the temperature less than the boiling point of the droplets Fb when landing as the droplets Fb, so as to prevent violent boiling on the green sheet 4G.

A method for forming an interconnection pattern on the green sheet 4G using the droplet discharging device 20 will now be described.

As shown in FIG. 2, the droplet discharging device 20 places the green sheet 4G on the stage 23, and the discharged surface 4Ga of the green sheet 4G is arranged to be on top. At this time, the stage 23 arranges the green sheet 4G to be away from the carriage 29 in the negative y-axis direction. The green sheet 4G includes the via holes 7 and the via interconnections 8, and the droplet discharging device 20 forms the internal interconnections 6 as an interconnection pattern on the discharged surface 4Ga.

In this state, the bitmap data BD for forming the internal interconnections 6 is input into the control device 50 from the input-output device 51. The control device 50 stores the bitmap data BD input from the input-output device 51. Here, the control device 50 heats the entire part of the green sheet 4G evenly to the predetermined temperature, by driving the rubber heater H through the rubber heater drive circuit 55. That is to say, the temperature of the discharged surface 4Ga of the green sheet 4G is controlled to be equal to or higher than that of the metallic ink F at the time of its discharging from the discharging head 30, and, to be less than a boiling point of a liquid composition included in the metallic ink F (less than the temperature of a liquid composition with the lowest boiling point).

Subsequently, the control device 50 carries the stage 23 by driving the y-axis motor MY through the y-axis motor drive circuit 53, so that the discharging head 30 can pass directly above the target patterning positions. At the same time, the control device 50 drives the x-axis motor MX through the x-axis motor drive circuit 52, so as to start the scanning operation (reciprocation) of the discharging head 30.

The control device 50 generates, after starting the scanning operation (reciprocation) of the discharging head 30, the pattern forming control signal SI based on the bitmap data BD, and outputs the pattern forming control signal SI and the driving voltage COM to the head drive circuit 54. That is to say, the control device 50 drives each of the piezoelectric elements PZ through the head drive circuit 54, and makes the discharging head 30 eject the droplets Fb from the selected nozzles N, every time the discharging head 30 is positioned the location for forming the internal interconnections 6. The droplets Fb landing on this green sheet 4G is dried rapidly, since the green sheet 4G is heated to the temperature equal to or higher than the temperature of the droplets Fb upon discharging. Moreover, since the green sheet 4G is the breathable substrate, one of the droplets Fb evaporates into the green sheet 4G, as shown in FIG. 6, being promoted to dry further.

In this embodiment, each of the droplets Fb being discharged sequentially lands on each location for forming the internal interconnections 6, as shown in FIG. 7 and FIGS. 8A to 8D. Specifically, in this embodiment, each of the droplets Fb landing previously to the other for patterning stays in a pinning state on the green sheet 4G, since it partially dries, thereby preventing itself from spreading. The subsequent droplet Fb landing thereafter on the green sheet 4G is discharged at the location indicated in a dashed-dotted line in FIGS. 7 and 8A, so that it partly covers the previous droplet Fb.

That is to say, the timing in which the discharging head 30 ejects the droplets Fb is determined based on the period of time such as the time required for the droplets Fb discharged from the discharging head 30 to be fixed (pinned) to the green sheet 4G, and the time the discharging head 30 travels in order to move from one position to the other, the first position being where the previous droplet Fb is discharged, and the second position being where the subsequent droplet Fb is discharged. Consequently, the droplet discharging device 20 has an discharging timing, or, an discharging interval set in advance as a result of experiments, the interval calculated using conditions such as the traveling speed of the discharging head 30, and the temperature to which the green sheet 4G is heated.

The droplet discharging device 20 rapidly dries the droplet Fb landing on the green sheet 4G previously to another, while discharging the droplets Fb in the aforementioned discharging intervals during the reciprocation of the discharging head 30 in the x-axis direction.

Figure 8A:
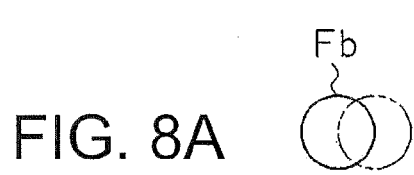
FIGS. 8A to 8D illustrate a droplet discharging sequence during the pattern formation.
Figure 8B:
Figure 8C:
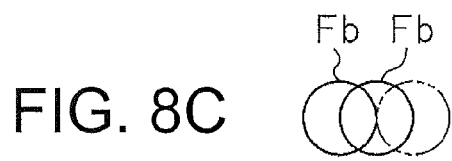

Thereafter, when the previous droplet Fb become fixed to the green sheet 4G as shown in FIG. 8B, the subsequent droplet Fb lands at the location indicated in a dashed-dotted line in FIG. 8C, partly covering the previous droplet Fb which is already in a fixed state. At this time, the previous droplet Fb in the fixed state is pinned to the green sheet 4G, and therefore it is not pulled closer to the subsequent droplet Fb. The subsequent droplet Fb partly covering the previous droplet Fb includes a part that does not overlap with the previous droplet Fb, and this part is heated by the green sheet 4G. Therefore the subsequent droplet Fb immediately starts to dry up, rapidly reaching a fixed state. As a result, the subsequent droplet Fb is not pulled toward the previous droplet Fb.

Figure 8D:
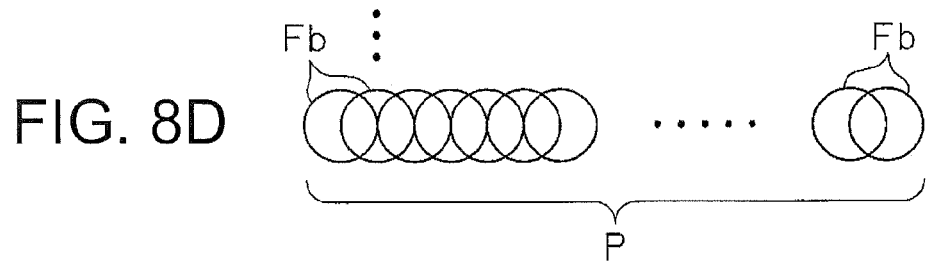

As a result, the droplets Fb sequentially landing on locations for forming the internal interconnections 6 dry up without deviating from their landing position. The droplet discharging device 20 thereby forms an interconnection pattern P for the internal interconnections 6, as shown in FIG. 8D. Here, heating the green sheet 4G and using the breathable substrate as the green sheet 4G allows the droplet discharging device 20 to rapidly dry and fix the landing droplet Fb to the green sheet 4G. As a result, the discharging intervals of the droplet Fb discharged by the droplet discharging device 20 may be shortened, and the interconnection pattern P for the internal interconnections 6 is therefore formed in a short period of time. Further, the droplet discharging device 20 forms the interconnection pattern P in a reliable manner, since the temperature of the green sheet 4G is controlled to the temperature below the boiling point of the droplets Fb, in order to avoid violent boiling of the landing droplets Fb.

The control device 50 carries out the scanning (reciprocation) of the discharging head 30 in the x-axis direction, completing the initial operation of the droplets Fb. Subsequently, in order to eject the droplets Fb onto new locations on the green sheet 4G for forming the internal interconnections 6, the control device 50 carries the stage 23 in the y-axis direction in a predetermined distance, by driving the y-axis motor MY through the y-axis motor drive circuit 53, and thereafter carries out the scanning (reciprocation) of the discharging head 30.

Similar to the above operation, after starting the scanning (reciprocation) of the discharging head 30, the control device 50 drives the piezoelectric elements PZ based on the bitmap data BD through the head drive circuit 54. Thereafter, the control device 50 commands the discharging head 30 to eject the droplets Fb from the selected nozzles N, every time the discharging head 30 is positioned at the location for forming the internal interconnections 6. In this case, similar to the above operation, one of the droplets Fb landing on the green sheet 4G previously to the other immediately starts drying and rapidly dries. Thereafter, when the previous droplets Fb become fixed to the green sheet 4G, the control device 50 lands the subsequent droplet Fb, so that the subsequent droplet Fb partly covers the previous droplet Fb which is in the fixed state.

The control device 50 carries out the reciprocation of the discharging head 30 which moves forward and backward in the x-axis direction, and carries the stage 23 in the y-axis direction. The control device 50 repeats discharging of droplets Fb during the reciprocation of the discharging head 30 with timings set forth by the bitmap data BD. The droplet discharging device 20 thereby forms, on the green sheet 4G, the interconnection pattern P for the internal interconnections 6 made by the droplet Fb.

The effects of the first embodiment which has the aforementioned configuration will now be described.

1. According to the first embodiment, the droplet Fb landing on this green sheet 4G rapidly dries out, since the green sheet 4G is heated to the temperature equal to or higher than the temperature of the droplet Fb upon discharging. As a result, the discharging intervals of the droplets Fb discharged by the droplet discharging device 20 may be shortened, thereby forming the interconnection pattern P in a short period of time.

2. According to this embodiment, since the green sheet 4G is a breathable substrate, the droplets Fb evaporate into the green sheet 4G, further promoting the drying. As a result, the discharging intervals of the droplets Fb discharged by the droplet discharging device 20 may be shortened, thereby forming the interconnection pattern P in a short period of time.

3. According to this embodiment, no bumping occurs in the droplets Fb landing on the green sheet 4G, since the temperature thereof is controlled to be equal to or lower than that of the boiling point of the droplets Fb. As a result, the droplet discharging device 20 can form the interconnection pattern P with a high density in a high precision.

4. According to this embodiment, the droplet discharging device 20 lands the consecutive droplets Fb in a manner that, if one of the droplets Fb landing previously to the other is in a fixed state, the subsequent droplet Fb lands in a way that some part thereof overlaps with the previous droplet Fb. Consequently, the previous droplets Fb in the fixed state are not pulled closer to the subsequent droplet Fb landing so that it partly covers the previous droplet Fb. As a result, the droplet discharging device 20 can form the interconnection pattern P with a high density in a high precision.

5. According to this embodiment, the droplet discharging device 20 evenly heats the entire top surface of the green sheet 4G with the rubber heater H. Therefore, the droplets Fb landing on the green sheet 4G evaporates from their periphery, causing the concentration of the solid constituent (particles) to reach to a saturating concentration faster relative to their center. As a result, the droplets Fb that have landed stops expanding in the planer direction of the green sheet 4G. That is to say, the droplets Fb that have landed reaches to a fixed state from their periphery, so as to maintain the outer shape thereof upon landing. As a result, the droplet discharging device 20 can form the interconnection pattern P with a high density in a high precision.

6. According to this embodiment, the droplet discharging device 20 sets the discharging interval using the time required for the droplets Fb to be fixed to the site, so that the subsequent droplet may be discharged after the previous droplet reaches the fixed state for certain.

Second Embodiment

A second embodiment into which the present invention is embodied will now be described with reference to FIGS. 9 to 11. The stage 23 of the first embodiment is modified in the second embodiment. Hereafter, the modification will be described in detail.

Figure 9:
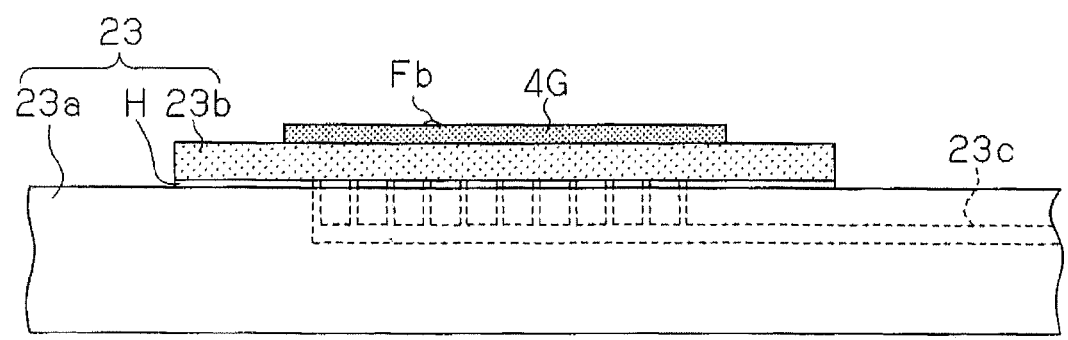
FIG. 9 is shows a structure of a stage.

Referring now to FIG. 9, the stage 23 includes a stage body 23a, the rubber heater H installed on the top surface of the stage body 23a, and a stage plate 23b arranged on the top surface of the rubber heater H so as to constitute the placing unit. The stage body 23a is installed on the top surface of the base 21, and moves forward and backward in the y-axis direction by receiving the driving force of the y-axis motor MY. The rubber heater H is installed between the stage body 23a and the stage plate 23b, and heats the green sheet 4G placed on the top surface of the stage plate 23b to a predetermined temperature. The stage plate 23b is a ceramic, breathable, and porous substrate, having the green sheet 4G placed thereon. The entire top surface of the green sheet 4G placed on the stage plate 23b is heated to a predetermined temperature, by receiving the heat from the rubber heater H through the stage plate 23b.

The stage 23 includes, as shown in a dotted line in FIG. 9, a vacuum channel 23c extending from the interior of the stage body 23a to the top surface of the rubber heater H. The vacuum channel 23c has shaft openings in the vicinity of one end, the shaft openings reaching the bottom surface of the stage plate 23b, opened to face the green sheet 4G placed on the stage plate 23b. The vacuum channel 23c has another opening at the other end, the opening coupled with an unillustrated vacuum tube that is coupled to the side surface of the stage body 23a. The vacuum tube is coupled with a vacuum pump VP (refer to FIG. 11), so that the pressure beneath the stage plate 23b is reduced through the vacuum tube and the vacuum channel 23c. At this time, since the stage plate 23b is a porous substrate having breathability, the vacuum force of the vacuum pump VP reaches the entire bottom surface of the green sheet 4G through the stage plate 23b. The vacuum force working on the bottom surface of the green sheet 4G adsorbs the green sheet 4G to the stage plate 23b.

Figure 10:
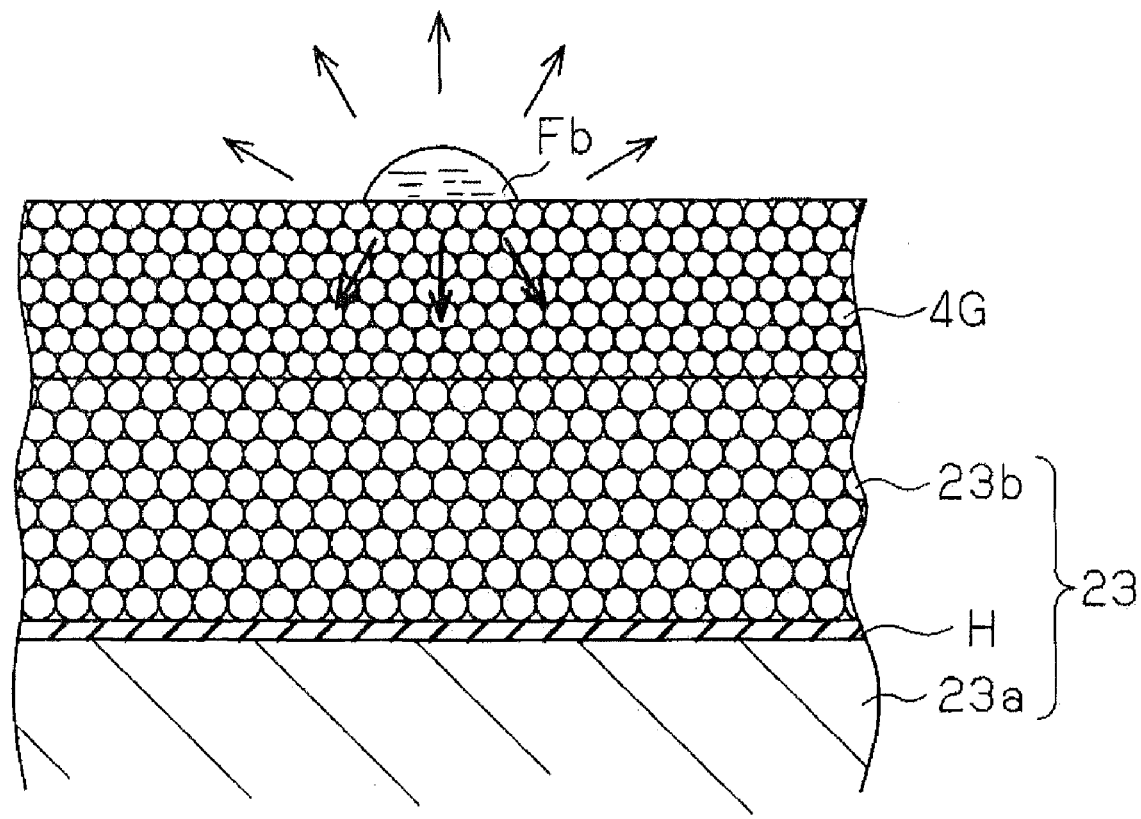
FIG. 10 is a schematic view of a sectional structure of the green sheet.

Referring now to FIG. 10, the metallic ink F (droplet Fb) landing on the green sheet 4G vaporize part of the solvent or the dispersion medium from the surface of the droplet Fb. At this time, since the green sheet 4G is heated, the evaporation of the solvent or the dispersion medium contained in the metallic ink F is promoted. Moreover, as shown in FIG. 10, since the green sheet 4G is a breathable substrate, the droplet Fb landing thereon vaporizes part of its solvent or dispersion medium through the green sheet 4G, also from the side adjacent to the green sheet 4G. Therefore, the required drying time of the droplet Fb landing on the green sheet 4G is furthermore shortened.

Moreover, since the green sheet 4G is placed on the stage plate 23b that has breathability, the bottom surface thereof is sucked by the vacuum force of the vacuum pump VP working through the stage plate 23b. The droplet Fb landing on the green sheet 4G receives this vacuum force of the vacuum pump VP, and therefore further diffuses the solvent or the dispersion medium into the green sheet 4G. As a result, the required drying time of the droplet Fb landing on the green sheet 4G is furthermore shortened.

In this embodiment, the droplet Fb landing on the green sheet 4G does not interfuse into the green sheet 4G, by setting, to a predetermined range, the conditions such as the porosity of the green sheet 4G, the vacuum force working at the bottom surface of the green sheet 4G, and the contact angle of the droplet Fb landing on the green sheet 4G (breathable substrate).

The electric configuration of the droplet discharging device 20 formed as above will now be described with reference to FIG. 11.

Figure 11:
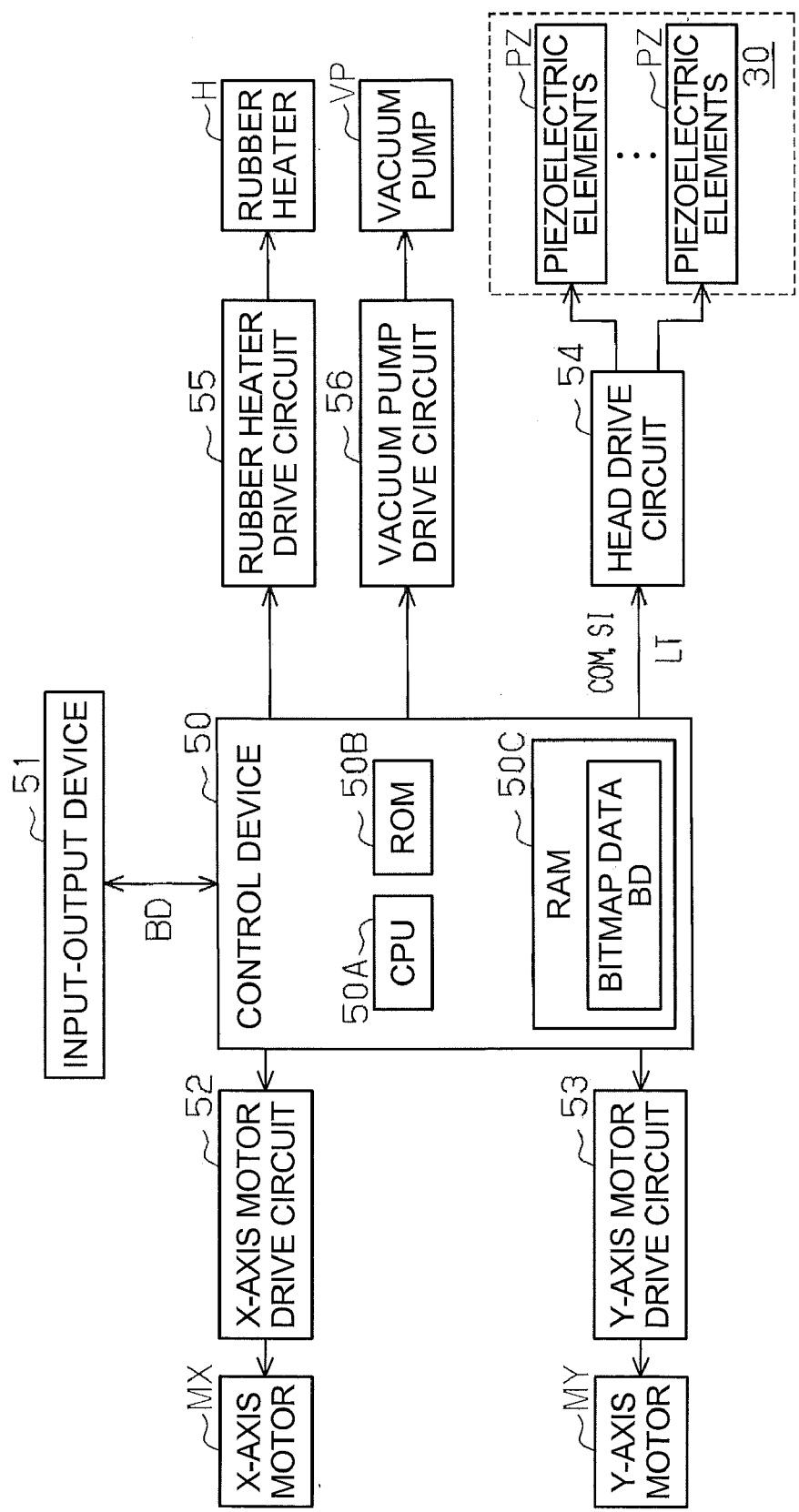
FIG. 11 is a block diagram of the droplet discharging device.

Referring now to FIG. 11, the control device 50 carries out, in accordance with various data and various control programs stored therein, sets of processing for: carrying the stage 23 and the carriage 29; discharging droplets with the discharging head 30; heating the rubber heater H; and reducing the pressure beneath the green sheet 4G.

A vacuum pump drive circuit 56 is coupled to the control device 50. The control device 50 outputs the drive control signal to the vacuum pump drive circuit 56. The vacuum pump drive circuit 56 drives the vacuum pump VP in response to the drive control signal from the control device 50, and thereby fixes the green sheet 4G placed on the stage plate 23b in a predetermined decompressed state.

Here, the control device 50 heats the entire green sheet 4G evenly to the predetermined temperature, by driving the rubber heater H installed in the stage body 23a. That is to say, the temperature of the discharged surface 4Ga of the green sheet 4G is controlled to be equal to or higher than that of the metallic ink F at the time of its discharging from the discharging head 30, and, to be less than a boiling point of a liquid composition included in the metallic ink F (less than the temperature of a liquid composition with the lowest boiling point). Moreover, the control device 50 drives the vacuum pump VP with the vacuum pump drive circuit 56, and reduces the pressure beneath the green sheet 4G placed on the stage plate 23b. Since the pressure beneath the green sheet 4G is reduced, further promoting the diffusion of the vapor of the droplet Fb into the interior of the green sheet 4G, the required drying time of the droplet Fb is furthermore shortened.

The effects of the second embodiment having the aforementioned configuration will now be described.

7. According to this embodiment, since the pressure beneath the green sheet 4G is reduced, the metallic ink F landing on the green sheet 4G further promotes the diffusion of its vapor into the interior of the green sheet 4G. As a result, the required drying time of the metallic ink F landing on the green sheet 4G is furthermore shortened.

8. Moreover, since the green sheet 4G is placed on the breathable and porous substrate, i.e., stage plate 23b, the pressure beneath the green sheet 4G is reduced through the porous stage plate 23b. Therefore the entire area beneath the green sheet 4G is evenly decompressed. As a result, the vapor of the droplets Fb landing on the green sheet 4G evenly diffuses without irregularity from the surface adjacent to the green sheet 4G, independently from the landing location.

9. Further, since the vapor evaporating from the droplet Fb is aggregated to the vacuum pump VP through the vacuum channel 23c, the droplet discharging device 20 can reduce the contamination caused by the vapor.

The second embodiment may be modified as the followings.

In the second embodiment described above, the stage plate 23b is a breathable porous ceramic substrate. The material for the stage plate 23b is not limited thereto, as long as it is breathable. For instance, a breathable sintered metal may be used.

In the above embodiment, the stage 23 includes the rubber heater H and the stage plate 23b stacked on the stage 23, the stage plate 23b being made of a breathable porous ceramic substrate. An example of the modification may be a structure in which the top surface of the stage body 23a has a concave to which bottom the rubber heater H is installed, and the stage plate 23b is installed on the top of the rubber heater H.

Moreover, the entire stage 23 may either be a breathable porous ceramic, or, a breathable porous sintered metal.

In the above embodiment, when the droplet discharging device 20 lands consecutive droplets Fb so that one partly covers the other, the subsequent droplet lands after the previous droplets Fb become fixed to the green sheet 4G. Not limited thereto, and the droplet discharging device 20 may also land the subsequent droplet Fb before the previous droplet Fb becomes fixed on the green sheet 4G.

In the above embodiment, the subsequent droplet Fb lands so that it partly covers the previous droplet Fb. Not being limited thereto, the subsequent droplet Fb may not need to partly cover the previous droplet Fb.

In the above embodiment, the previous droplet Fb and the subsequent droplet Fb overlap at the droplet pitch of half the diameter of the landing droplet. However, the size of the overlap may optionally be modified.

In the above embodiment, in order to form the interconnection pattern P, the manner the plurality of droplets Fb overlap is in accordance with a discharging sequence. The sequence of discharging is not limited thereto, and the interconnection pattern P may be formed in another discharging sequence of the droplets Fb, as shown in FIGS. 12A to 12F.

Figure 12A:
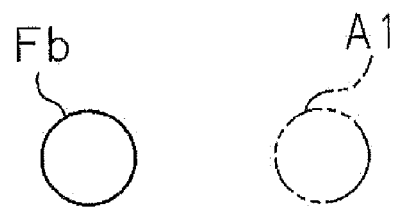
FIGS. 12A to 12F illustrate the pattern formation process using another droplet discharging sequence.
Figure 12B:
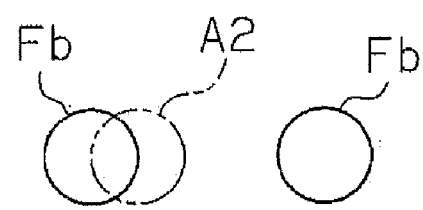

Referring now to FIG. 12A, when the previous droplet Fb lands on the predetermined location for patterning, the subsequent droplet Fb lands at a landing location A1 indicated in a dashed-dotted line, away from the droplet Fb that has landed. After the droplet Fb lands on the landing location A1, the subsequent droplet Fb lands on a landing location A2 indicated in a dashed-dotted line in FIG. 12B, so as to partly cover the droplet Fb which landed the first.

Figure 12C:
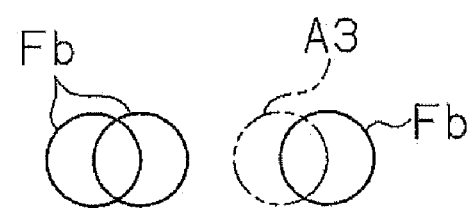
Figure 12D:
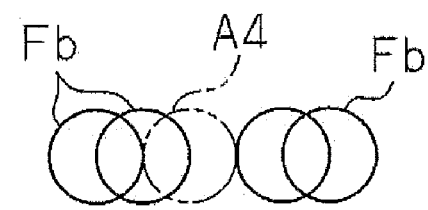
Figure 12E:
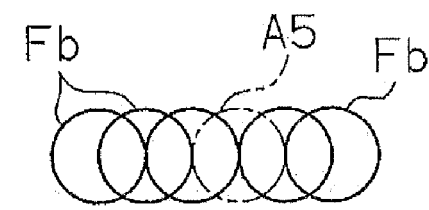
Figure 12F:
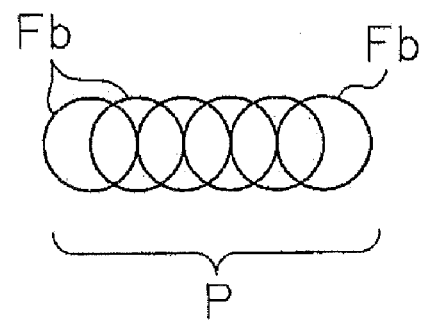

After the droplet Fb lands on the landing location A2, the subsequent droplet Fb lands on a landing location A3 indicated in a dashed-dotted line in FIG. 12C, so as to partly cover the droplet Fb which landed on the landing location A1. Similarly, the droplets Fb are dispensed on landing locations A4 and A5 in the sequence shown in FIGS. 12D and 12E. The interconnection pattern P is therefore formed as shown in FIG. 12F.

In the above embodiment, the rubber heater H heats the green sheet 4G. However, the method of heating is not limited thereto, and may include other heating methods for heating the green sheet 4G.

In the above embodiment, the metallic ink F is an embodiment of the functional fluid. However, a functional fluid containing a liquid crystal material may also be the embodiment of the functional fluid. In other words, the functional fluid may be any fluid which is to be discharged for patterning.

In the above embodiment, the green sheet 4G is the embodied as a substrate. However, the substrate is not limited thereto, and may include any substrate as long as it is a breathable substrate and does not immediately interfuse droplets.

In the above embodiment, the discharging head 30 driven by a piezoelectric element is embodied as a droplet discharging unit. However, the droplet discharging head may also be embodied as a discharging head using electrostatic drive or resistance heating.

What is claimed is:

1. A method for producing a pattern on a substrate, comprising:
    disposing the substrate on a breathable porous stage, the breathable porous stage being formed of ceramic particles;
    discharging a droplet onto a target surface of the substrate while the substrate is being heated, the substrate being breathable,
    wherein the droplet includes a functional fluid containing a functional material which produces the pattern on the target surface of the substrate,
    the substrate is a porous substrate comprising a low temperature firing sheet including a ceramic particle and resin, and
    the functional fluid includes a metal particle dispersed therein as the functional material.

2. The method for producing a pattern according to claim 1, wherein:
    a pressure on a side of the substrate opposite the target surface is reduced during the discharging of the droplet.

3. The method for producing a pattern according to claim 1, wherein:
    a temperature of the target surface of the substrate is at least equal to a temperature of the functional fluid at the time of discharging the droplet but less than a boiling point of a liquid composition included in the functional fluid.

4. A droplet discharging device, comprising:
    a stage for supporting a substrate, the stage being porous, breathable, and formed of ceramic particles;
    a heating unit included in the stage and adapted to heat the substrate; and
    a droplet discharging head adapted to discharge a functional fluid containing a functional material as a droplet onto a target surface of the substrate placed on the stage to produce a pattern on the target surface of the substrate;
    wherein the stage and the droplet discharging head are adapted to move relative to one another,
    the substrate is a breathable, porous substrate comprising a low temperature firing sheet including a ceramic particle and resin, and
    the functional fluid includes a metal particle dispersed therein as the functional material.

5. The droplet discharging device according to claim 4, wherein the stage includes a decompressing unit adapted to reduce a pressure on a side of the breathable substrate opposite to the target surface through the decompressing unit.

* * * * *